(12) United States Patent
Kobayashi et al.

(10) Patent No.: US 7,369,758 B2
(45) Date of Patent: May 6, 2008

(54) MOLECULAR BEAM SOURCE FOR USE IN ACCUMULATION OF ORGANIC THIN-FILMS

(75) Inventors: Osamu Kobayashi, Ibaraki-ken (JP); Tateo Saito, Ibaraki-ken (JP)

(73) Assignee: Chosu Industry Co., Ltd., Sanyoonoda-shi, Yamaguchi (JP)

( * ) Notice: Subject to any disclaimer, the term of this patent is extended or adjusted under 35 U.S.C. 154(b) by 86 days.

(21) Appl. No.: 11/183,720

(22) Filed: Jul. 18, 2005

(65) Prior Publication Data

US 2005/0247267 A1   Nov. 10, 2005

(51) Int. Cl.
*C23C 14/12*   (2006.01)
*C23C 14/24*   (2006.01)

(52) U.S. Cl. ...................... 392/389; 118/726
(58) Field of Classification Search ............... 118/726; 392/389

See application file for complete search history.

(56) References Cited

U.S. PATENT DOCUMENTS

| | | | |
|---|---|---|---|
| 4,565,158 A * | 1/1986 | Koprio .................. | 118/726 |
| 5,253,266 A * | 10/1993 | Knodle et al. ............. | 373/10 |
| 5,336,324 A * | 8/1994 | Stall et al. ................. | 118/719 |
| 5,820,681 A | 10/1998 | Colombo et al. | |
| 2002/0197418 A1 | 12/2002 | Mizukami et al. | |
| 2003/0175422 A1* | 9/2003 | Cord .................... | 427/248.1 |

FOREIGN PATENT DOCUMENTS

| | | |
|---|---|---|
| JP | 2003 002778 | 1/2003 |
| JP | 2003 095787 | 4/2003 |

OTHER PUBLICATIONS

Webster's II New Riverside University Dictionary, Houghton Mifflin Co., 1984. pp. 859 and 869.*

* cited by examiner

*Primary Examiner*—Richard Bueker
(74) *Attorney, Agent, or Firm*—Flynn, Thiel, Boutell & Tanis, P.C.

(57) ABSTRACT

A molecular beam source for use in accumulation of organic thin-films which enables the forming of a uniform thin-film on film-forming surfaces of a large-sized substrate, but without producing deposition or separation of a film-forming material in an opening for discharging molecules of the film-forming material, wherein a valve 33 is disposed in a space starting from a side of a molecule heating portion 12 and reaching to a molecule discharge opening 14 for discharging the generated molecules of the film-forming material towards a film-forming surface and, further, heaters 18 and 19 are provided at a side of the molecule discharge opening 14 for heating the molecules of the film-forming material to be discharged. At the side of the molecule discharge opening 14 are provided an exterior guide 13 having a tapered guide wall and also an interior guide 16 having a tapered guide wall is provided within an inside of the exterior guide. Between the exterior guide 13 and interior guide 16, there is formed a molecule discharge passage 17 in which the diameter thereof gradually increases along a direction of the discharge of the molecules therefrom. The heaters 18 and 19 are provided on the exterior guide 13 and the interior guide 16, respectively and, further, there is provided a heater 20 penetrating through the molecule discharge opening 14, whereby narrowing and/or blockage hardly occur in the discharge opening.

1 Claim, 6 Drawing Sheets

MOLECULAR BEAM SOURCE FOR USE IN ACCUMULATION OF ORGANIC THIN-FILMS

BACKGROUND OF THE INVENTION

The present invention relates to a molecular beam source for use in accumulation of organic thin-films, for heating a material to be formed on a surface of a solid body or matter, such as, a substrate, etc., in the form of a thin-film, thereby melting and evaporating the film-forming material, i.e., generating evaporated molecules for growing the thin-film upon the surface of the solid body, and it relates to, in particular, a molecular beam source for use in accumulation of the thin-film of an organic material and suitable for accumulating the thin-film of an organic material upon the film forming surface of the solid body, such as the substrate, etc.

In recent years, attention has been paid to organic thin-film elements, such as an organic electroluminescence (i.e., EL) and/or an organic semiconductor as being typical or representative ones thereof. With these thin-film elements, an organic material is heated within a vacuum so as to blast the vapor thereof onto the substrate and then it is cooled down to be solidified or bonded thereon. In general, the following method is applied, wherein an organic material is put into a melting pot or a crucible, which is made of a material having a high melting-point, such as, tungsten, etc., and then the material to be formed into a film is heated up through heating the periphery of the crucible by means of a heater, thereby generating a vapor thereof to be blasted onto the substrate.

However, since most of the organic materials, i.e., the film-forming materials, are inferior, in particular, in the heat conductivity thereof, it is impossible to heat the film-forming material uniformly by the evaporating means as mentioned above and, therefore, there is a drawback that it results into unevenness or non-uniformity in generation of the vapor. It is also apparent that this drawback brings about a further large problem, in particular, of trying to put a large amount of the organic material into the crucible.

As described in the following Patent Document 1, it is proposed to put a material which is thermally and chemically stable, as well as greatly superior to the film forming material in the thermal conductivity thereof, together with the film forming material, into the crucible, thereby obtaining a solution to the drawback mentioned above.

Further, as another drawback relating to the evaporating means of the film-forming material, there is also pointed out an ill effect, i.e., since the vapor of the organic film-forming material can be generated under the condition of a high vapor pressure and low temperature, the vapor of the film-forming material is unintentionally or unexpectedly generated if only putting that material into the crucible and disposing it within a vacuum, and thereby bringing about contamination onto the substrate. For dealing with the drawback mentioned above, there is proposed an idea, as is described in the following Patent Document 2, of adjusting the amount of vapor through a needle valve, while making the crucible into a closed type in the structure thereof.

Patent Document 1: Japanese Patent Laying-Open No. 2003-2778; and

Patent Document 2: Japanese Patent Laying-Open No. 2003-95787.

BRIEF SUMMARY OF THE INVENTION

From studies made by the inventors of the present invention, it is possible to generate the vapor uniformly by putting material into the crucible, which is superior in thermal conductivity, together with the film forming material. However, it is also found out that, if trying to form a thin-film of the organic material, uniformly or evenly, upon the film-forming surface of a large-sized substrate, it is necessary to provide a large distance between an evaporation source on the substrate and, therefore, it deteriorates or lowers the efficiency of using the material greatly. Also, though an interruption of an opening for discharging molecules by means of the needle valve is a superior one for achieving control upon discharge/stoppage of the vapor of material, however, it is too narrow as the opening for discharging the molecules therefrom, i.e., near to a point-like and, therefore, there also brings about a drawback that it cannot be applied into the forming of a uniform thin-film upon the film-forming surface of the large-sized substrate.

Also, the organic film-forming material has a high vapor pressure and generates the vapor thereof at a low temperature, however, it can be easily re-condensed by lowering its temperature. For this reason, when the vapor of the film-forming material makes contact with a wall surface in the vicinity of the opening for discharging the molecules and when the temperature goes down, then the organic film-forming material is separated or deposited on the wall surface. As a result of this, the opening for discharging the molecules therefrom is narrowed or blocked, thereby lowering the efficiency of the film-forming on the substrate or bringing about ill effects in the film-forming. In addition thereto, the organic film-forming material, re-condensed or solidified in the vicinity of the opening for discharging the molecules therefrom, exfoliates from the wall surface to be dispersed within a vacuum space floating under the dust-like condition thereof, i.e., increasing the chance that it adheres upon the film surface on which a film should be formed.

According to the present invention, which has been achieved by taking the drawbacks of the conventional molecular beam source for use in accumulation of organic thin-films as was mentioned above into consideration. In particular, by making studies upon the structures of portions for discharging molecules, in particular, in the opening for discharging molecules therefrom, and as a result thereof, an object is to provide a molecular beam source for use in accumulation of organic thin-films, enabling the formation of a uniform thin-film on the film-forming surface of the large-sized substrate, as well as preventing the film-forming material from being separated or deposited in the opening for discharging molecules of the film-forming material, thereby hardly causing narrowing and/or blockage in the opening for discharging.

For accomplishing the object mentioned above, according to the present invention, firstly there is provided a molecular beam source for use in accumulation of organic thin-films, in particular, for use in evaporation of an organic material, comprising: a vapor generating source; an exterior guide having a tapered guide wall on a side of a molecule discharge opening for discharging molecules of a film-forming material, which are generated in said vapor generating source, towards a film-forming surface; an interior guide provided within an inside of said exterior guide and having a tapered guide wall; a molecule discharge passage formed between said exterior guide and said interior guide and having a tapered diameter which gradually enlarges along the direction of discharge of the molecules. Heaters are provided within the exterior guide and the interior guide, respectively, and thereby form the heaters within an outside and an inside of the molecule discharge passage.

With this molecular beam source which disposes the heater at the molecule discharge opening where the vapor can be easily re-condensed, so that the evaporation material is prevented from being separated or deposited in the vicinity of the molecule discharge opening, narrowing and/or blockage will hardly occur in the opening for discharging molecules, which will be caused due to the re-condensation or separation of the vapor. This enables the discharging of the vapor with stability.

Also, according to the present invention, with the molecular beam source having the heaters disposed as was mentioned above, it further comprises a heater provided penetratingly through said molecule discharge passage, neighboring to members for supporting said exterior guide and said interior guide. Therefore, it is possible to prevent the produced vapor from re-condensing or solidifying on the support members, which penetrate through the molecule discharge passage. With this, it is also possible to protect the molecule discharge passage from narrowing and/or blocking, in particular, in a portion just before reaching the molecule discharge opening.

Also, according to the present invention, with the molecular beam source having the heaters disposed as was mentioned above, it further comprises a valve provided in a path starting from said vapor generating source and reaching to said molecule discharge opening for discharging the molecules of the film-forming material, which are generated in said vapor generating source, toward the film-forming surface. Therefore, it is possible to heat the material without the vapor leaking out by closing the valve when starting the evaporation thereof. For this reason, it is possible to maintain a balanced pressure, easily, at the pressure depending upon the material temperature at a side of the vapor-generating source. Under this condition, it is possible to maintain a completely uniform or even pressure at the side of the vapor-generating source.

However, according to the present invention, within the molecular beam source, disposing the heaters as mentioned above, the heater provided at the side of the molecule discharge opening has a higher winding density compared to that of the heater provided at the side of the vapor generating source. By doing this, it is possible to prevent the vapor from re-condensing or solidifying in the molecule discharge opening, with certainty.

Further, according to the present invention, within the molecular beam source, with the heaters disposed as was mentioned above, the interior guide and the exterior guide are made movable with each other, directing to the film-forming surface. With this, it is possible to adjust an opening portion of the molecule discharge opening to be wide or narrow. Also, since it is possible to shift the central position of the opening portion of the molecule discharge opening, the discharge condition of the molecules can be determined, arbitrarily, depending upon, for example, the size or an area, etc., on the film-forming surface to be formed with a thin-film thereon.

BRIEF DESCRIPTION OF THE DRAWINGS

Those and other objects, features and advantages of the present invention will become more readily apparent from the following detailed description when taken in conjunction with the accompanying drawings wherein.

DETAILED DESCRIPTION OF THE INVENTION

In accordance with the present invention, a valve is disposed on a route of a vapor, thereby enabling to shut down the vapor to be discharged from. Also, a heater is provided at the side of the molecule discharge opening where the vapor can easily condense or solidify; thereby preventing the evaporation material from being separated or deposited in the vicinity of the molecule discharge opening.

Hereinafter, embodiments according to the present invention will be fully explained by referring to the attached drawings.

Embodiment

Figure 1:
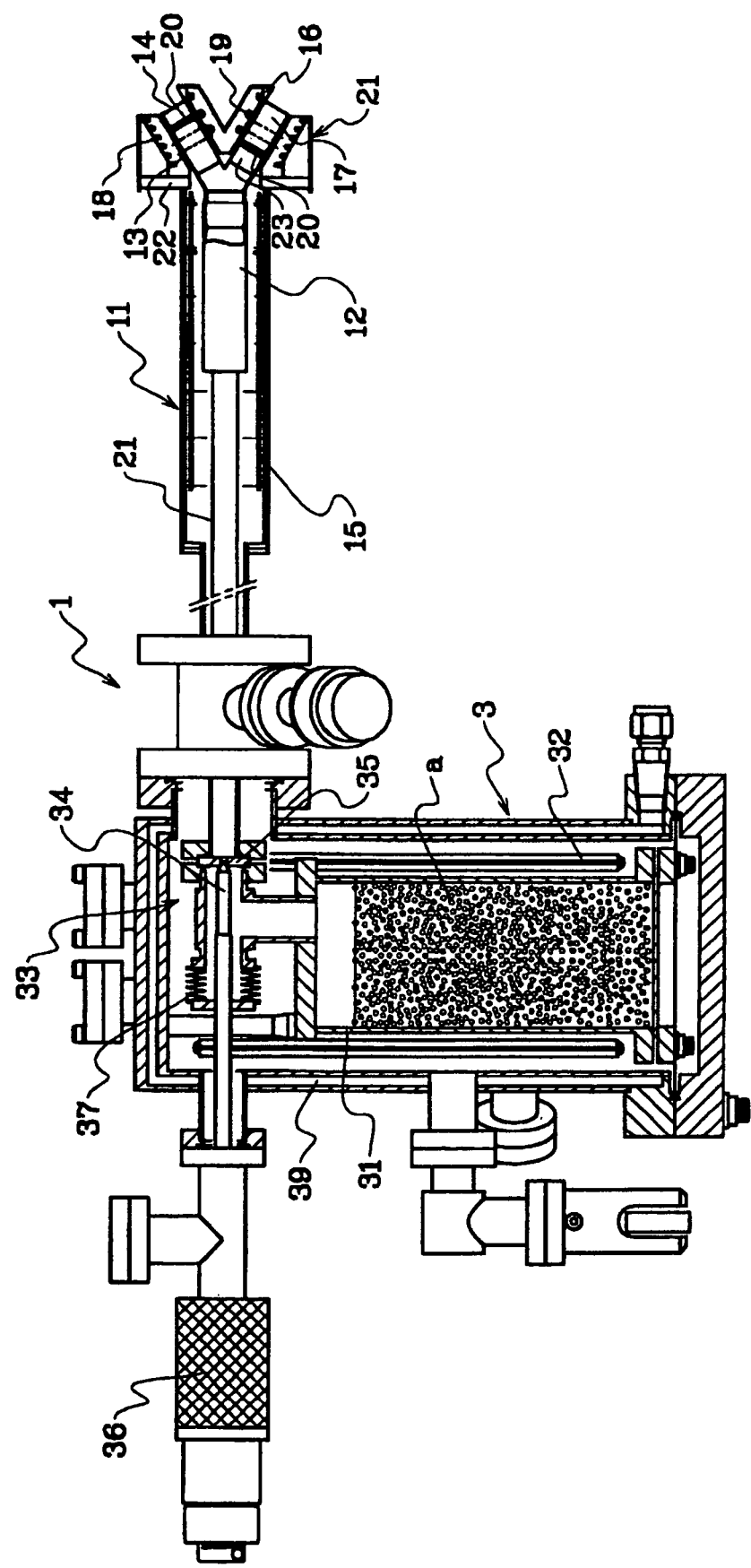
FIG. 1 is a vertical cross-section view showing a molecular beam source for use in accumulation of organic thin-films according to an embodiment of the present invention.

FIG. 1 shows a molecular beam source cell 1 for irradiating a film-forming material "a", through sublimation or evaporation thereof.

Figure 6:
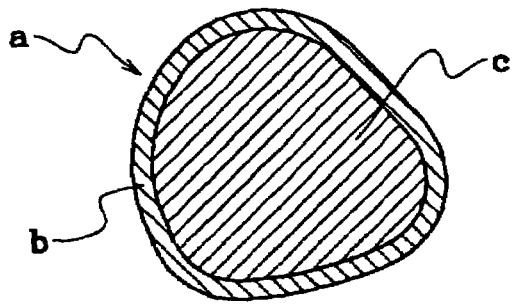
FIG. 6 is a vertical cross-section view showing a heating material to be received within a crucible of the molecular beam source for use in accumulation of the organic thin-films mentioned above.

A heating material receiving portion 3 of the molecular-beam source cell 1 has a cylinder-like vapor-generating source crucible 31 made of a metal, such as, SUS or the like, i.e., a material having a high thermal conductivity, and within this crucible 31 is received the heating material "a" to be heated. This heating material "a" has, as shown in FIG. 6, a coating of film-forming material "b", which is a main component of a film, on the surface a core, i.e., a grain-like thermo-conductive or heat-transfer medium "c". The heating material "a" is received within the crucible 31 of the heating material receiving portion 3 mentioned above.

Also, in the place of the coating of the film-forming material "b" on the surface of the heat-transfer medium "c", the film-forming material "b" and the heat-transfer medium "c" may be received within the crucible 31 of the heating material receiving portion 3, under the condition of being uniformly mixed at an appropriate ratio or combination thereof. For example, the volume ratio between the film-forming material "b" and the heat-transfer medium "c", to be received within is, preferably, 70%:30% or more or less.

The heat-transfer medium "c" is stable, thermally and chemically and, further, is made of a material having a heat conductivity higher than that of the film-forming material "b". For example, the heat-transfer medium "c" is made of a high heat-transfer material such as Pyrolithic Boron Nitride (PBN), silicon carbide, or aluminum nitride, etc.

As is shown in FIG. 1, around the crucible 31 is provided a heater 32, and an outer periphery thereof is surrounded by a shroud 39, which is cooled by using liquid nitrogen, etc. By means of a temperature measuring means (not shown in figures) such as a thermocouple, etc., for example, which is provided on the crucible 31, the calorific or heat value of the heater 32 is controlled, and the film-forming material "b" received within the crucible 31 is sublimated or evaporated through heating of the heating material "a" within the crucible 31, thereby generating molecules thereof. Also, when stopping the heat generation of the heater 32, so as to cool down the interior of the crucible by means of the shroud 39, then the heating material "a" is cooled down, and at the same time, the sublimation or the evaporation of the film-forming material is stopped.

During heating, the film forming material "b" is heated up through the heat-transfer medium "c". Since the heat-transfer medium "c" is higher in heat conductivity than the film-forming material "b", the heat is transferred or propagated up to the center of the crucible 31 with the aid of this heat-transfer medium "c", even in a case where the heat cannot reach up to the center of the crucible 31 only with the film-forming material "b", and then also the film-forming material "b" located at the center of the crucible 31 is heated, to melt and/or evaporate. By doing so, the film-forming material "b" received within the crucible 31 can be heated, melted, and evaporated, thoroughly or uniformly.

Also, since the heat-transfer medium "c" is made of a material which is stable, thermally and chemically, such as Pyrolithic Boron Nitride (PBN), silicon carbide, or aluminum nitride, etc., it will not melt nor evaporate, if being heated by the heater 32, up to such a degree that the film-forming material "b" evaporates. Accordingly, no molecule of the heat-transfer medium "c" is contained within the vapor molecules emitted from a vapor discharge opening 2 of the crucible 31 and, therefore, it gives no ill influence upon the composition of a film of growing up crystals thereon.

However, when the film-forming material "b" is an organic low-molecular material or an organic polymeric material having an EL luminescence function or capacity, the temperature of vaporization is far lower, compared to that of a metal, such as copper, etc., i.e., almost equal to or less than 200° C. On the other hand, the heat-durable temperature thereof is also relatively low and, therefore, it is necessary to heat at a temperature equal to or higher than the vaporization temperature and also equal to or lower than the heat-durable temperature, for obtaining the evaporation of the organic low-molecular or organic polymeric material mentioned above.

A valve 33 is provided on a side where molecules of the film-forming material are discharged from the crucible 31. This valve 33, a so-called needle valve, has a sharp needle 34 and a valve seat 35 including a molecule pass opening, which can be closed, choked or narrowed in the cross-section area of a flow passage thereof, through insertion of a tip of the needle 34. The needle 34 mentioned above is moved in a direction of the center axis thereof, through a linear movement, which is introduced through a bellows 37 with the aid of a servomotor 36.

As is shown in FIG. 1, the molecular pass opening of the valve seat 35, which can be opened or closed by the valve 33, is in communication with or conducted through an introduction passage 21 to a molecule discharge portion 11. This molecule discharge portion 11 has a cylindrical molecule heater chamber 12, and a heater 15 is provided around the molecule heater chamber 12. The molecule heater chamber 12 communicates with the valve 33 mentioned above through the introduction passage 21 for guiding or introducing the molecules evaporated into the molecule heater chamber 12. The molecules of the film-forming material leak from a side of the valve 33 mentioned above and reach the molecule discharge portion 11 through the introduction passage 21, then they are heated again to a desired temperature by the heater 15 within the molecule heater chamber 12 and emitted from a molecule discharge opening 14 towards a substrate, which is disposed within a vacuum chamber or vessel.

Figure 2:
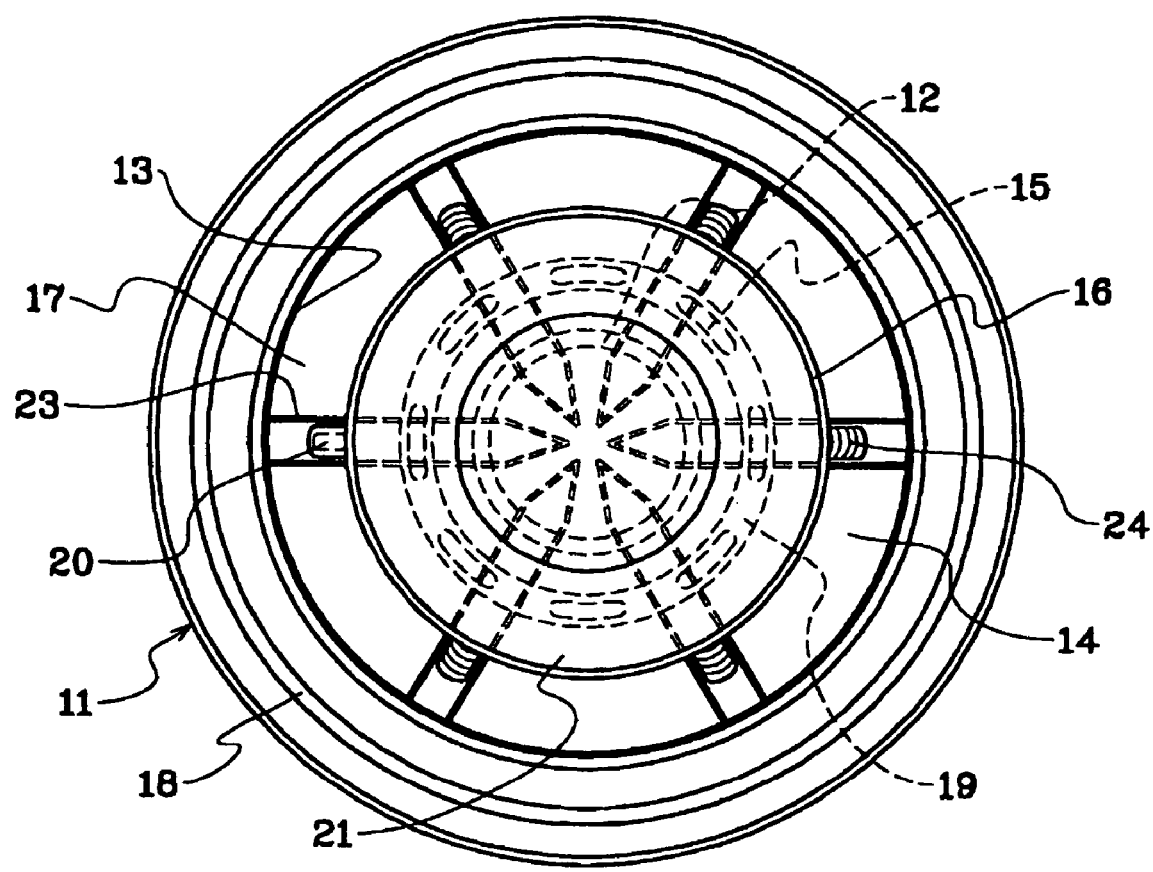
FIG. 2 is a front view of the molecular beam source for use in accumulation of organic thin-films mentioned above.
Figure 3:
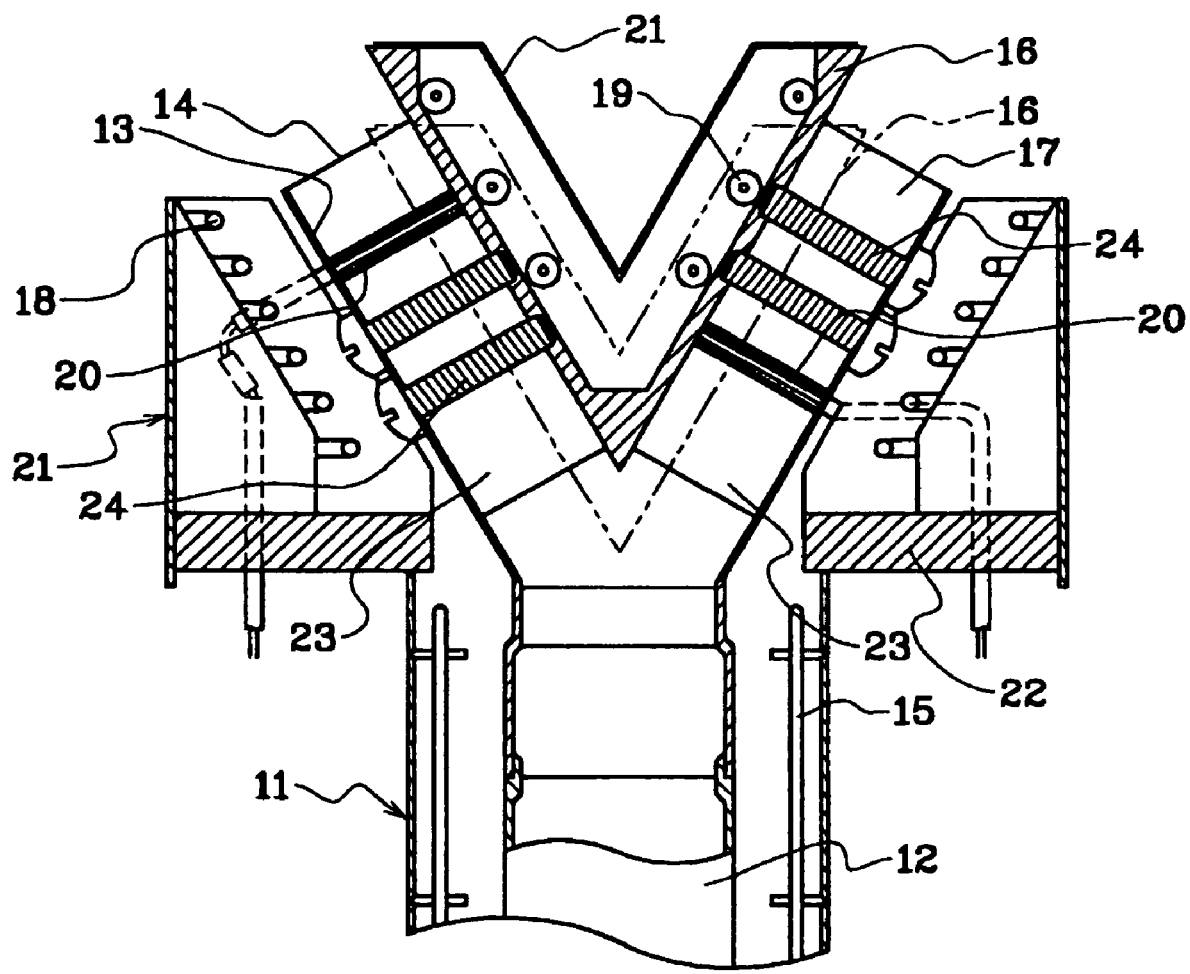
FIG. 3 is an enlarged vertical cross-sectional side view showing a principle portion, including a molecule discharge portion and a cooling/heating unit disposed outside thereof, of the molecular beam source for use in accumulation of organic thin-films mentioned above.

FIGS. 2 and 3 show the details of the molecule discharge portion 11, at a tip of the molecular-beam source cell 1.

Between the peripheral portion at the tip of the molecule heater chamber 12 and the molecule discharge opening 14, there is provided an exterior guide 13. An inner surface of this exterior guide 13 defines a tapered guide surface which gradually enlarges in diameter along a direction from the tip peripheral side of the molecule heater chamber 12 to the molecule discharge opening 14.

Further, within the inside of this exterior guide 13, there is provided an interior guide 16. As is shown in FIG. 3, an outer surface of this interior guide 16 also defines a guide surface having a slope or an inclination the same as that of the inner guide surface of the exterior guide 13 mentioned above, i.e., this guide surface is also shaped to be tapered, gradually enlarging in diameter along the direction from the tip peripheral side of the molecule heater chamber 12 to the molecule discharge opening 14. Between the guide surface of this interior guide 16 and the guide surface of the exterior guide 13, there is defined a molecule discharge passage 17 reaching from the tip peripheral side of the molecular heater chamber 12 to the molecule discharge opening 14.

Into the molecule discharge passage 17 defined between the interior guide 16 and the interior guide 13 are inserted supports 23, in radial directions at an angle of 45°. Each of the supports 23 of the embodiment shown in the figure is made up with two (2) pieces of plate-like members, which are disposed on the interior guide 16 and the exterior guide 13 and separated at a distance in the circumferential direction thereof. Into those supports 23 are inserted screws 24, and those supports 23 are fixed onto the interior guide 16 and the exterior guide 13 by means of the screws 24. With the aid of the supporting structures of the support members, mainly including those supports 23 and the screws 24, etc., the interior guide 16 and the exterior guide 13 are disposed in a concentric manner with fitting the central axes thereof to each other, and are fixed to each other.

Figure 4:
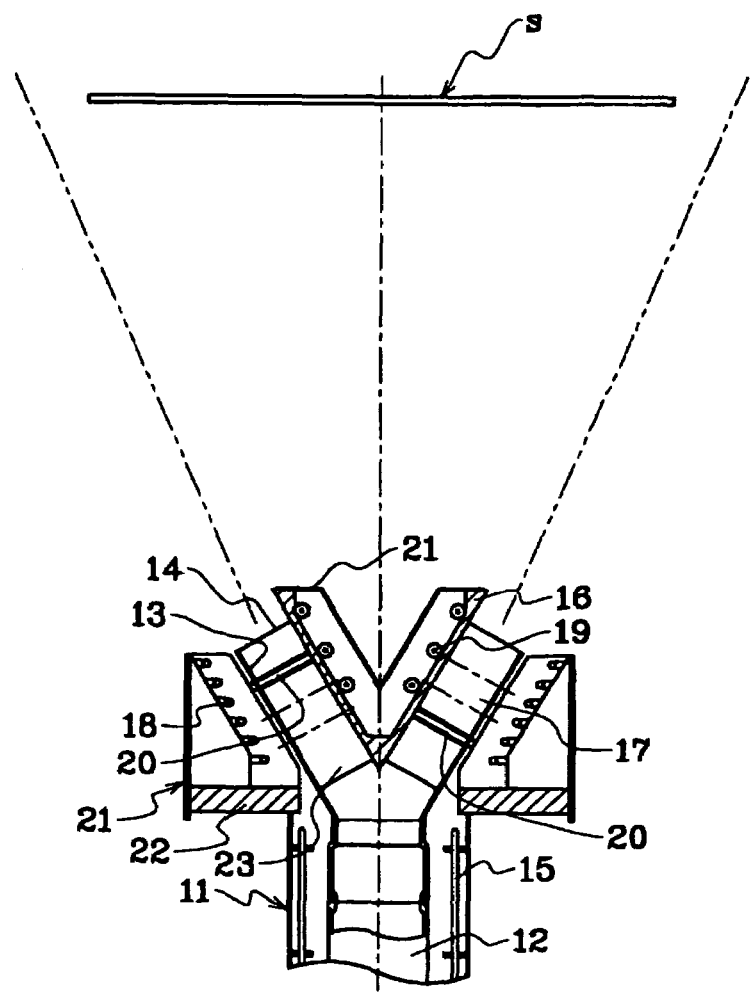
FIG. 4 is an enlarged vertical cross-sectional side view showing the principle portion, in particular, under the condition when forming a film on a substrate with using the molecular beam source for use in accumulation of the organic thin-films mentioned above.
Figure 5:
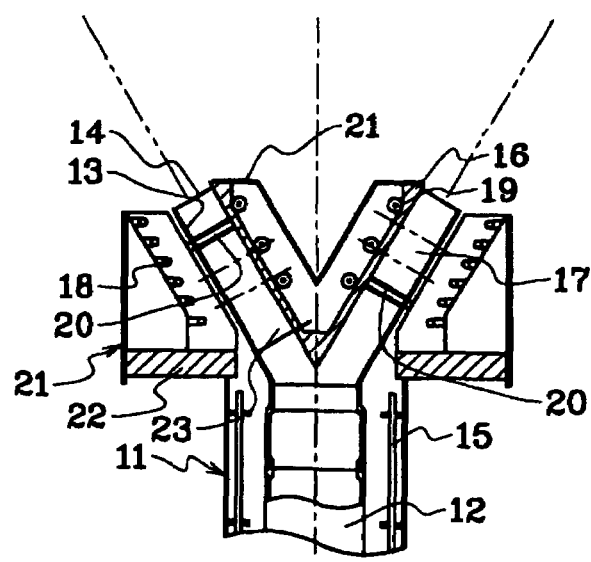
FIG. 5 is an enlarged vertical cross-sectional side view showing the principle portion, in particular, under the condition when forming the film on the substrate at a position of shifting the interior guide from that shown in FIG. 4 above.

The interior guide 16 is able to move towards the exterior guide 13 in a direction directed to the film-forming surface of a substrate, on which a thin-film should be formed, and to be fixed at an arbitrary position thereof. The movable direction of the interior guide 16 is the vertical direction (or up-down direction) in FIG. 3. The position of the interior guide 16, which is shown by two-dot chain lines in FIG. 3, indicates that when it is moved backward from the position of the interior guide 16 shown by solid lines back to a side of the molecule discharge portion 11. At the time when the interior guide 16 is located at the position shown by the solid lines, the tapered guide surface of the interior guide 16 is close to the guide surface, i.e., the inner surface of the exterior guide 13, compared to the position shown by the two-dot chain lines, therefore, the molecule discharge passage 17 becomes narrow. FIG. 4 shows the condition when the interior guide 16 is at the position shown by the solid lines in FIG. 3. Also, FIG. 5 shows the condition when the interior guide 16 is at the position shown by the two-dot chain lines in FIG. 3. In this manner, the interior guide 16 is able to move into the vertical direction in FIG. 3, and also it is fixed at the arbitrary position thereof.

On an outside of the exterior guide 13 is disposed a cooling/heating unit 21, which comprises a heater 18 and a cooler 22, and this exterior guide 13 is surrounded by the cooling/heating unit 21. The cooler 22 of the cooling/heating unit 21 cools down or refrigerates the exterior guide 13 from the surrounding thereof, by the use of a cooling liquid, for example, water or liquid nitrogen, etc. Also, the heater 18 of the cooling/heating unit 21, utilizes a micro-heater therein, for example, heats up the exterior guide 13 from the exterior thereof, thereby heating the molecule discharge passage 17 provided within the inside thereof. The density of the calorific value of the heater 18 of the cooling/heating unit 21, i.e., amount of heat generated per unit area thereof, is determined to be larger than that of the heater 15 provided within the periphery of the molecule heater chamber 12. For this reason, the winding density of the heater 18 is higher than that of the heater 15 in the molecule heater chamber 12.

Furthermore, also in the interior guide 16 is installed a heater 19. This heater 19 also utilizes a micro-heater therein, for example, heats up the interior guide 16 from the inside thereof, thereby heating the molecule discharge passage 17 provided in the outside thereof. The density of the calorific value of the heater 19 of the interior guide 16, i.e., amount of heat generated per a unit area thereof, is determined to be larger than that of the heater 15, which is provided within the periphery of the molecule heater chamber 12. For this reason, the winding density of the heater 19 is higher than that of the heater 15 in the molecule heater chamber 12.

Within the molecule discharge passage 17 provided between the exterior guide 13 and the interior guide 16, there is disposed or wired a heater 20, penetrating therethrough. This heater 20 penetrates through the molecule discharge passage 17, under the condition of being inserted into the supports 23 together with the screws inserted into the supports 23 mentioned above, i.e., being close to the supports 23 and the screws 24 therein. As the heater 20 penetrating through the molecule discharge passage 17, it is appropriate to utilize an intermediate line of the heater connecting between the exterior heater 18 and the interior heater 19, however, the heater 20 may be made separate from, independently, heaters 18 and 19.

In this manner, in addition to the heaters 18 and 19 being disposed in the vicinity of the molecule discharge opening where the vapor can easily re-condense or solidify, i.e., in more detail, at the outside and the inside of the molecule discharge passage 17, and further with the provision of the heater 20 penetrating through the molecule discharge passage 17, then, the evaporated material is prevented from depositing on or separating in the vicinity of the molecule discharge opening 14, with certainty. With this, narrowing and/or blockage hardly occur in the molecule charge opening, which will be generated due to re-condensation or solidification of the vapor. In particular, since the heater 20 penetrates through the molecule discharge passage 17 under the condition of being inserted into the supports 23 together with the screws 24 inserted within the supports 23, it enables the prevention of the vapor from re-condensing or solidifying on the support members, such as, the support 23, the screw 24, etc., which are provided penetratingly through the molecule discharge passage 17, with certainty.

Figure 7:
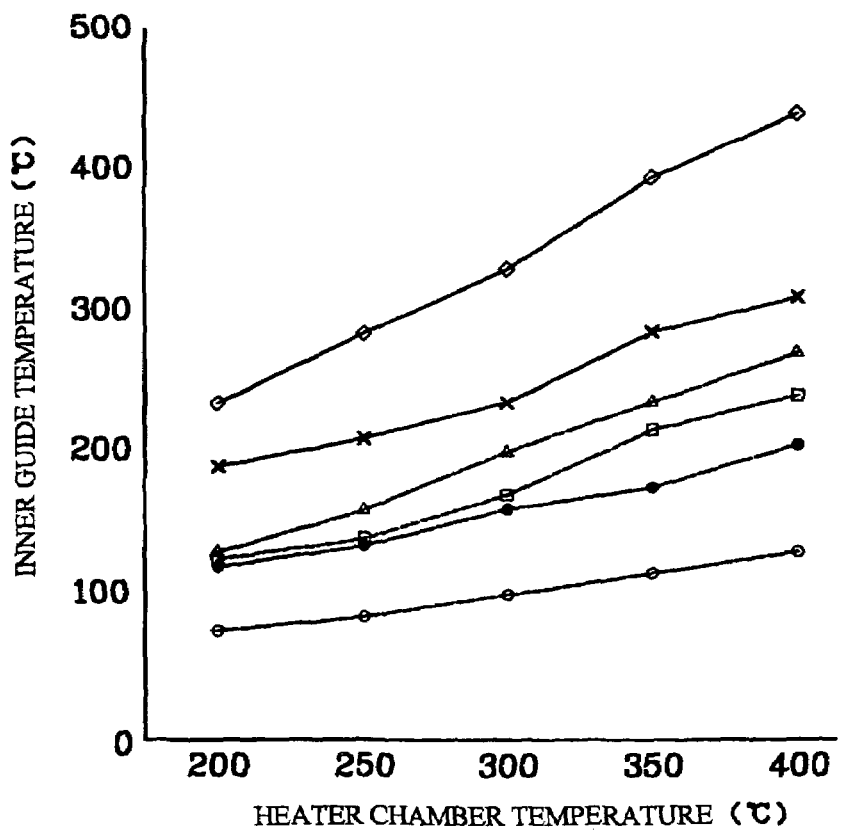
FIG. 7 is a graph showing temperatures on a side of a molecule heating chamber and also on a side of a molecule discharge opening when discharging the molecules therefrom, while heaters are provided not only on the molecule heating chamber, but also on the side of molecule discharge opening within the molecular beam source for use in accumulation of organic thin-films mentioned above.
Figure 8:
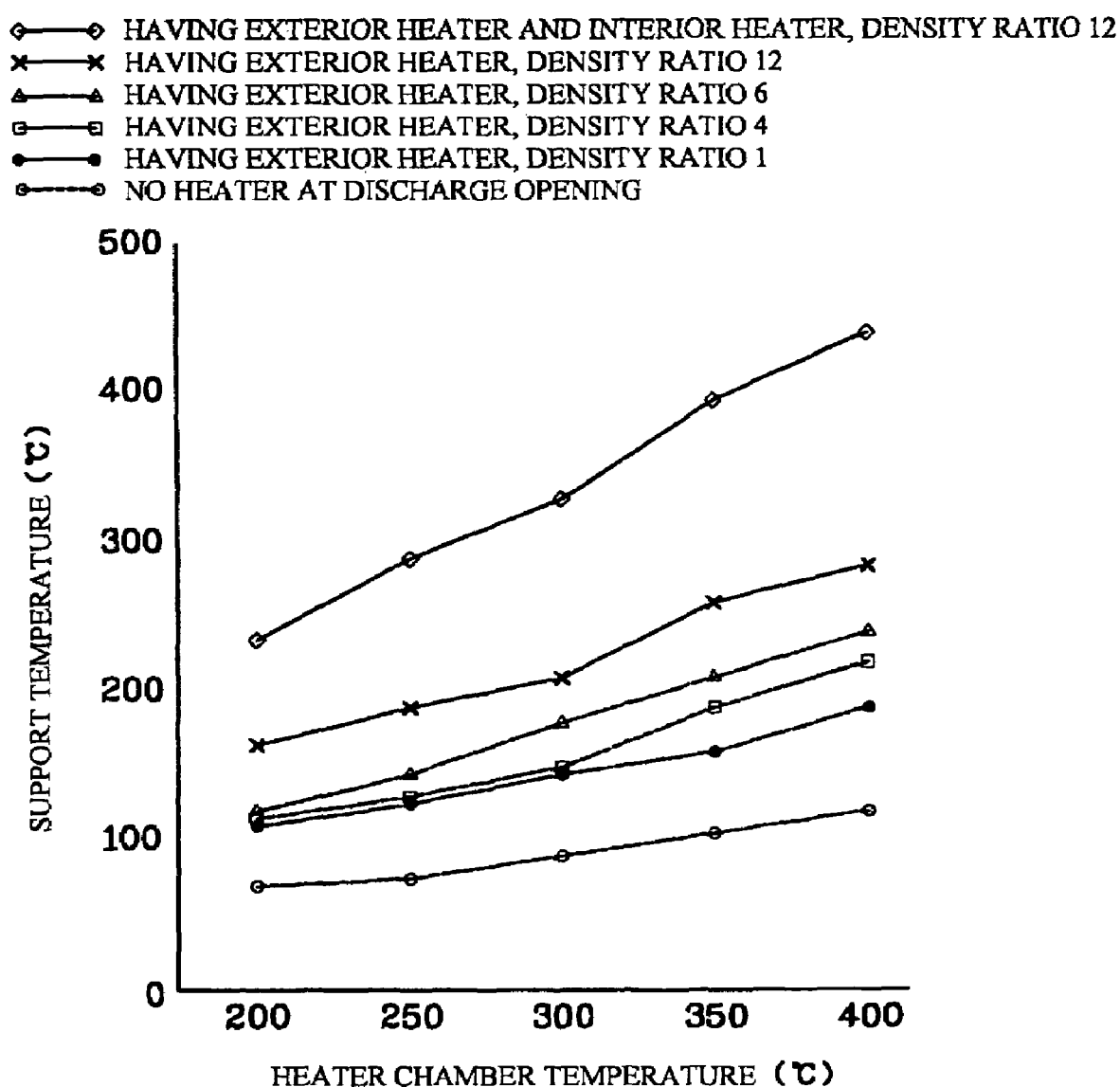
FIG. 8 also is a graph showing temperatures at a side of a molecule heating chamber and at a side of the molecule discharge opening, when discharging the molecules, while the heaters are provided not only on the molecule heating chamber, but also on the side of molecule discharge opening, within the molecular beam source for use in accumulation of the organic thin-films mentioned above.

FIGS. 7 and 8 show the results, obtained through measurements of temperatures on a wall surface of the interior guide 16, when heating up the molecule discharge passage 17, but further with the provision of the heater 18 on a side of the exterior guide 13 and the heater 19 on a side of the interior guide 16 other than the heater 15 on a side of the molecule heater chamber 12, in an actual test or experiment of molecule discharge. In particular, FIG. 7 shows the results of the measurement made at a tip side of the wall surface of the interior guide 16, near to the molecule discharge opening 14, as being a temperature-measurement point. FIG. 8 shows the results of the measurement made at a base portion of the support, near to the molecule heater chamber 12, as being a temperature-measurement point. The measurements are made while changing the wall-surface temperature of the molecule heater chamber 12 within a range from 200° C. to 400° C., with heating a side of the molecule heater chamber 12 by means of the heater 15. In those cases, including the cases of not providing the heater 18 on the side of the exterior guide 13 and the heater 19 on the side of the interior guide 16, the measurements are made by using several kinds of heaters to be the heater at the side of the molecule discharge opening 14, which have different densities of windings thereof. The winding densities of the heater 18 and 19 are each indicated by a ratio similar to that of the heater 15 at the side of the molecule heater chamber 12.

Since the support members, for fixing the exterior guide 13 and also the interior guide 16, are facing or fronting the outside where the molecules are discharged, they can be easily lowered in the temperature thereof, due to radiation. For this reason, the molecules of the film-forming material to be discharged from the molecule discharge opening 14 can be easily condensed or solidified again when they touch on or contact with the exterior guide 13 and/or the interior guide 16, due to the heat absorption thereon.

Then, with the provision of the heater 18 at the side of the exterior guide 13, having a winding density of four (4) or more times higher than the heater 15 at the side of the molecule heater chamber 12, it is possible to bring the wall-surface temperature of the interior guide 16 to be near that of the molecule heater chamber 12. Further, also with the provision of the heater 19 at the side of the exterior guide 16, and bringing the winding densities of both to be twelve (12) times higher than the heater 15 at the side of the molecule heater chamber 12, it is possible to keep the wall-surface temperature of the interior guide 16 to be equal to or higher than that of the molecule heater chamber 12. Moreover, by inserting the heater 20 into the supports 23 together with the screws 24, penetrating through the molecule discharge passage 17, the support members, such as the supports 23 and the screws 24, etc., which are provided penetratingly through the molecule discharge passage 17, can be maintained to be similar, in particular, with the temperature thereof.

As was fully mentioned above, according to the molecular beam source for use in accumulation of the organic thin-films, it is possible to prevent the vapor-generating source from unexpectedly discharging the vapor therefrom, thereby enabling the discharge of vapor under a stable standing condition and, therefore, it is possible to form the thin-film, with stability, on the film-forming surface of the substrate. With this, it is also possible to form a uniform thin-film, even on a large-sized substrate. Further, with the heater(s) provided at the side of the vapor discharge opening, it is possible to prevent the vapor of the film-forming material from re-condensing or solidifying and prevent the deposition or separation of the film-forming material in the vapor discharge opening. With this, narrowing and/or blockage will hardly occur in the molecule discharge opening. Therefore, it is possible to discharge the molecules, with stability, for a long time-period and it enables a stable film forming.

The present invention may be embodied in other specific forms without departing from the spirit or essential features or characteristics thereof. The present embodiment(s) is/are therefore to be considered in all respects as illustrative and not restrictive, the scope of the invention being indicated by the appended claims rather than by the forgoing description and range of equivalency of the claims are therefore to be embraced therein.

What is claimed is:

1. A molecular beam source for evaporating an organic material and accumulating a thin film of the organic material on a film-forming substrate, comprising:

a vapor generating source for generating molecules of the organic material, the vapor generating source comprising a crucible for containing the organic material, a first heater provided around the crucible for heating and vaporizing the organic material and a valve for controlling the flow rate of the vaporized organic material to a molecule discharge chamber, the valve comprising a valve seat having a molecule pass opening and a plunger for regulating the flow of the vaporized organic material through the molecule pass opening to an introduction passage disposed orthogonal to the crucible;

a molecule discharge chamber in communication with the introduction passage and comprising a cylindrical molecule heater chamber communicating with the introduction passage and a second heater provided around the molecule heater chamber for heating molecules of the vaporized organic material passing therethrough;

an exterior guide provided at an end of the molecule discharge chamber and comprising an inner wall which gradually tapers outward as it extends away from the molecule discharge chamber and terminates at a molecule discharge opening;

an interior guide disposed opposite to the exterior guide and having an exterior wall surface having a slope identical to the slope of the inner wall surface of the exterior guide, the exterior wall surface of the inner guide and the interior wall surface of the exterior guide forming a molecule discharge passage therebetween extending from the molecule heater chamber to the molecule discharge opening, and the interior guide being adjustable in position relative to the exterior guide to adjust the size of the molecule discharge opening;

a cooling/heating unit disposed outside of the exterior guide comprising a third heater for heating the exterior guide and the molecule discharge passage and a cooler for cooling the exterior guide;

a fourth heater provided in the interior guide for heating the interior guide and the molecule discharge passage, the fourth heater having a higher winding density than the second heater; and a fifth heater provided in the molecule discharge passage and extending between the interior guide and the exterior guide for heating the molecule discharge passage.

* * * * *